(12) United States Patent
Peterson et al.

(10) Patent No.: US 11,329,617 B1
(45) Date of Patent: May 10, 2022

(54) DUAL-CHANNEL CLASS-D AUDIO AMPLIFIER HAVING QUANTIZER-COMBINED ORTHOGONAL MODULATION

(71) Applicant: CIRRUS LOGIC INTERNATIONAL SEMICONDUCTOR, LTD., Edinburgh (GB)

(72) Inventors: Cory J. Peterson, Austin, TX (US); Chandra Prakash, Austin, TX (US); Ramin Zanbaghi, Austin, TX (US); Eric Kimball, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 17/151,877

(22) Filed: Jan. 19, 2021

(51) Int. Cl.
    *H03F 3/217*     (2006.01)
    *H03F 3/185*     (2006.01)

(52) U.S. Cl.
    CPC ....... *H03F 3/2173* (2013.01); *H03F 2200/03* (2013.01); *H03F 2200/165* (2013.01)

(58) Field of Classification Search
    CPC .............. H03F 3/2173; H03F 2200/03; H03F 2200/165
    USPC ...................................... 330/10, 251, 207 A
    See application file for complete search history.

(56) References Cited

U.S. PATENT DOCUMENTS

| | | |
|---|---|---|
| 7,053,806 B1 | 5/2006 | Rao et al. |
| 7,227,390 B1 | 6/2007 | Bapat et al. |
| 7,463,089 B1 | 12/2008 | Bapat et al. |
| 7,579,910 B2 | 8/2009 | Zhang et al. |
| 8,115,366 B2 | 2/2012 | Hoffman et al. |
| 8,803,569 B1 | 8/2014 | Malladi et al. |
| 9,319,033 B1 | 4/2016 | Jin et al. |
| 10,734,981 B1 | 8/2020 | Zanbaghi |
| 11,190,136 B2 | 11/2021 | Yuan et al. |

OTHER PUBLICATIONS

U.S. Appl. No. 16/869,226, entitled Common-Mode Leakage Error Calibration for Current Sensing in a Class-D Stage Using a Pilot Tone, filed May 7, 2020.
U.S. Appl. No. 17/161,815, entitled Common Mode Output Voltage Biasing in Class-D Audio Amplifiers Having Selectable Differential or Dual Single-Ended Operation, filed Jan. 19, 2021.

*Primary Examiner* — Hieu P Nguyen
(74) *Attorney, Agent, or Firm* — Mitch Harris, Atty at Law, LLC; Andrew M. Harris (57) ABSTRACT

Class-D amplifiers and modulators therefor provide control of the DC operating point of the outputs of the amplifiers. The modulators generate a sum and difference signal using combiners and introduce the sum signal to a reference input of the quantizer, while the quantization input of the quantizer receives the difference signal. A difference mode loop filter circuit may filter the difference signal and a common mode loop filter may filter the sum signal. Outputs of the quantizer operate a pair of switching circuits to provide either a differential output with the sum signal set to a constant voltage and the difference signal provided by the signal to be reproduced, or a pair of single-ended outputs with the individual input signals used to generate the sum and difference signal, and selection of a differential or dual single-ended operating mode may be performed by a control circuit that reconfigures the combiners.

20 Claims, 4 Drawing Sheets

DUAL-CHANNEL CLASS-D AUDIO AMPLIFIER HAVING QUANTIZER-COMBINED ORTHOGONAL MODULATION

BACKGROUND

1. Field of Disclosure

The field of representative embodiments of this disclosure relates to audio amplifier or haptic driver methods and circuits that are operable in a differential or dual single-ended configuration in which common-mode output voltage is controlled by receiving and combining sum and difference channel signals at a modulator.

2. Background

Audio amplifiers, and other amplifiers such as those for driving haptic feedback devices, generally require multi-channel operation, e.g., stereo audio amplifiers. In some instances, such as when generating higher power level signals, it is desirable to be able to configure two channels in a bridge configuration, i.e., in a differential configuration. A differential configuration can be easily operated from a single power supply voltage and its corresponding return node, as the bridge configuration of the two amplifier outputs permits both negative and positive signal excursions due to the differential operation of the two outputs.

Class-D amplifiers which may use pulse-width modulated (PWM), constant-edge modulated (CEM) or pulse-position modulated (PPM) type modulation, are typically used for integrated circuit (IC) power amplifiers and haptic drivers due to their high efficiency and ease of interface from digital circuits. Class-D amplifiers also easily provide differential operation, since the signal that operates one driver output can be inverted to provide a complementary driver output, requiring only one additional driver switch.

However, implementing a class-D amplifier that can be operated as two independent channels in a dual single-ended configuration, as well as in a differential configuration, typically requires two completely independent amplifier circuits, including the modulator stages and loop filter.

Therefore, it would be desirable to provide an improved a class-D amplifier that can be operated in either a differential or dual single-ended configuration without duplication of the entre class-D amplifier to provide a second channel.

SUMMARY

Improved class-D amplifier configuration and operation is accomplished in Class-D amplifier circuits, integrated circuits including Class-D amplifiers, modulators for Class-D amplifiers, and their methods of operation.

The modulators have a first signal input for receiving a first channel input signal, a second signal input for receiving a second channel input signal, a combiner network that combines the first channel input signal and the second channel input signal to generate a first loop filter input signal and a second loop filter input signal, a first loop filter that receives the first loop filter input signal and generates a first output signal therefrom, a second loop filter that receives the second loop filter input signal and generates a second output signal therefrom, and a quantizer that combines the first output signal and the second output signal and generates a first modulator output signal representative of the first channel input signal and a second modulator output signal representative of the second channel input signal.

In some embodiments, the combiner network determines a difference between the first channel input signal and the second channel input signal to generate the first loop filter input signal, and generates the second loop filter input signal representative of a sum of the first channel input signal and the second channel input signal. In some embodiments, a quantization input of the quantizer receives the first output signal and a reference input of the quantizer receives the second output signal.

The class-D amplifier circuits include a first signal input for receiving a first channel input signal, a second signal input for receiving a second channel input signal, and a combiner network that receives the first channel input signal and the second channel input signal and generates a sum signal representative of a sum of the first channel input signal and the second channel input signal and a difference signal representative of a difference between the first channel input signal and the second channel input signal. A modulator circuit receives and combines the sum signal and the difference signal and generates a first modulator output signal representative of the first channel input signal at a first modulator output and a second modulator output signal representative of the second channel input signal at a second modulator output. The class-D amplifier also has a first driver circuit including a first high-side switch coupling the first output of the class-D amplifier to a positive power supply and a first low-side switch coupling the first output of the class-D amplifier to a negative power supply. An input of the first driver circuit is coupled to the first modulator output. The class-D amplifier also includes a second driver circuit including a second high-side switch coupling a second output of the class-D amplifier to a positive power supply and a second low-side switch coupling the second output of the class-D amplifier to a negative power supply, so that an input of the second driver circuit is coupled to the second modulator output.

In some embodiments, the modulator of the class-D amplifier circuit may include a common mode loop filter circuit having an input coupled to a first output of the combiner for receiving the sum signal, a difference mode loop filter circuit having an input coupled to a second output of the combiner for receiving the difference signal, and a quantizer that receives and combines an output of the common mode loop filter circuit and an output of the difference mode loop filter circuit to generate the first modulator output signal and the second modulator output signal. A first feedback path may couple the first output of the class-D amplifier circuit and the second output of the class-D amplifier circuit to an input of the common mode loop filter circuit, so that the first feedback path controls a common mode voltage of the output of the first driver and the output of the second driver circuit. A second feedback path may couple the first output of the class-D amplifier circuit and the second output of the class-D amplifier circuit to the difference mode loop filter circuit. A quantization input of the quantizer may receive the output of the difference mode loop filter circuit and a reference input of the quantizer receives the output of the common mode loop filter circuit.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DETAILED DESCRIPTION OF ILLUSTRATIVE EMBODIMENT

The present disclosure encompasses circuits and integrated circuits that include improved Class-D amplifier circuits, modulators for the class-D amplifiers and their methods of operation. The class-D amplifiers provide for differential or dual single-ended operation via the same pair of output switching circuits, by providing a reference signal to a reference input of the modulator of the class-D amplifier that is derived from the input signal(s) to be reproduced. The outputs of the class-D amplifier may provide either a differential amplifier in which the common-mode voltage is controlled via the reference signal, or the class-D amplifier may provide two independent outputs that represent two independent input signals by combining the input signals as a sum, which is provided to the reference input of the modulator, and a difference, which is provided to the quantization input of the modulator. The mode of operation, either dual single-ended or differential may be made logic-selectable by reconfiguring the combiners at the inputs of the class-D amplifier.

Figure 1:
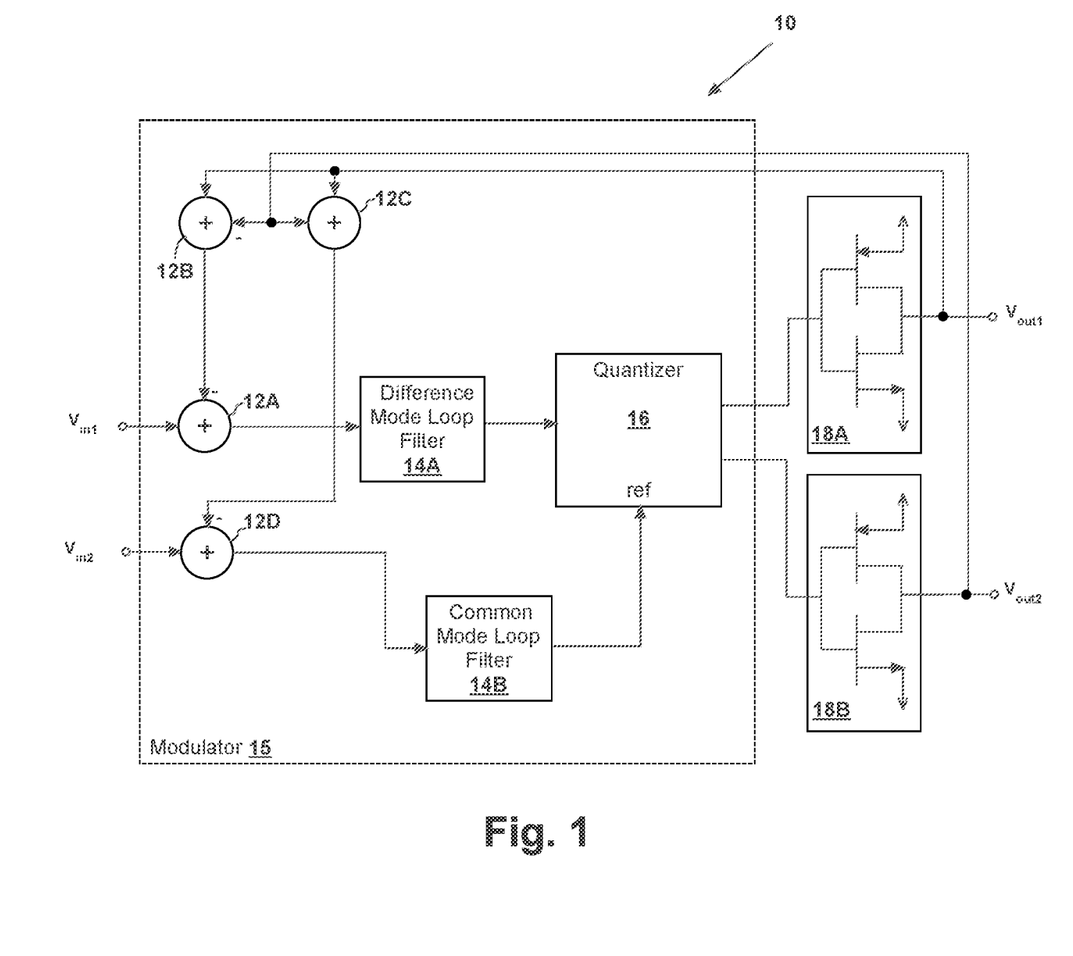
FIG. 1 is a block diagram of an example class-D amplifier 10, in accordance with an embodiment of the disclosure.

Referring to FIG. 1, a block diagram of an example class-D amplifier 10 is shown, in accordance with an embodiment of the disclosure. Example class-D amplifier 10 is a simplified amplifier circuit provided to describe the operating principles of other class-D amplifiers described below. An input signal $V_{in1}$ is provided to an input of a modulator 15 and is introduced to a difference mode loop filter 14A by a combiner 12A that subtracts a feedback signal provided by a combiner 12B. Combiner 12B subtracts the voltage of an output $V_{out2}$ of example class-D amplifier 10 from the voltage of another output $V_{out1}$ of example class-D amplifier 10. The output of difference mode loop filter 14A provides a quantization input to a quantizer 16, i.e., the input signal to be quantized. A differential output of quantizer 16 provides the output of modulator 15 that provides an input to a pair of power output switching circuits 18A, 18B, and thus outputs $V_{out1}$ and $V_{out2}$ have a pulse width resulting in an average differential voltage that is proportional to and representative of input signal $V_{in1}$. An input signal $V_{in2}$ is provided to an input of modulator 15 and is introduced to a common-mode loop filter 14B by a combiner 12D that subtracts a feedback signal provided by a combiner 12C. Combiner 12C adds the voltage of outputs $V_{out1}$ and $V_{out2}$ of example class-D amplifier 10. The output of common-mode loop filter 14B is provided to the reference input of quantizer 16 that determines the voltage(s) to which the output of difference mode loop filter 14A is compared to determine the output state of quantizer 16. Therefore, changes in the reference input of quantizer 16 result in a shift of the DC operating point of outputs $V_{out1}$ and $V_{out2}$ by effectively changing the quiescent pulse widths at outputs $V_{out1}$ and $V_{out2}$, which, when operating outputs $V_{out1}$ and $V_{out2}$ as a differential amplifier, provides control of their common-mode voltage according to input voltage $V_{in1}$. In order to use example class-D amplifier 10 as a differential amplifier reproducing a differential pair of voltages $V_+$, $V_-$, input signal $V_{in1}$ is set to an input voltage $V_{in1}=(V_+-V_-)/2$ and input signal $V_{in2}$ is set to an input voltage $(V_++V_-)/2$, which is the common-mode voltage of differential pair of voltages $V_+$, $V_-$. However, class-D amplifier is additionally capable of reproducing a pair of independent signals, e.g., a left channel input signal $V_L$ and a right channel input signal $V_R$ that form a stereo audio output, or alternatively are independent audio channel outputs or haptic driver channel outputs. Additional signal combiners transform the independent input signals to input voltages $V_{in1}$, $V_{in2}$ of respective input signals $V_{in1}$, $V_{in2}$, that will cause outputs $V_{out1}$ and $V_{out2}$ to assume voltages that represent input voltages $V_{in1}$, $V_{in2}$, respectively and independently, as will be described with reference to FIG. 2 and FIG. 3 below.

Figure 2:
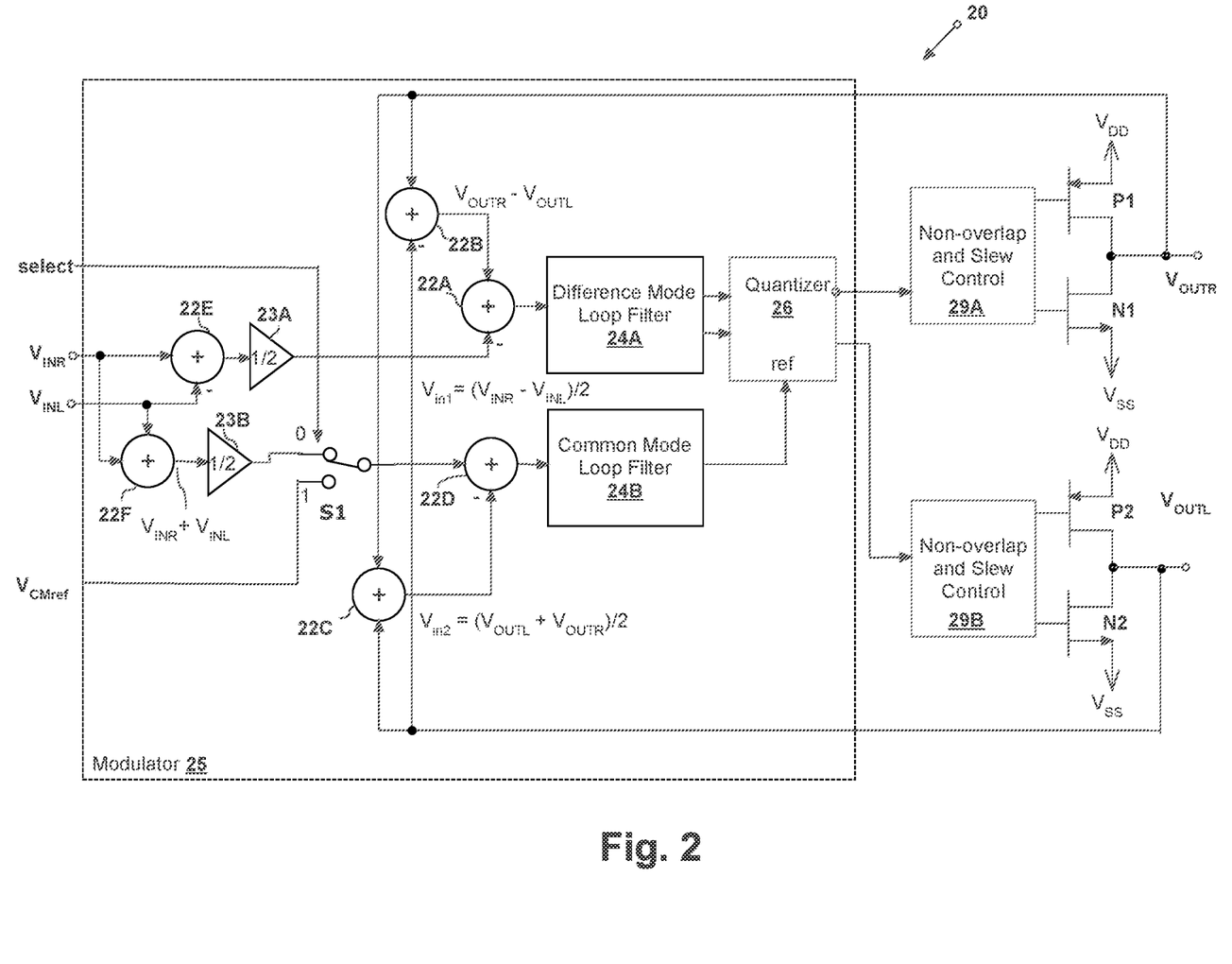
FIG. 2 is a block diagram of another example class-D amplifier 20, in accordance with an embodiment of the disclosure.

Referring now to FIG. 2, a block diagram of an example class-D amplifier 20 is shown, in accordance with an embodiment of the disclosure. Example class-D amplifier 20 is similar to example class-D amplifier 10, but further includes combiners 22E and 22F that combine independent input channel signals $V_{INL}$, $V_{INR}$ as described briefly above, in order to provide output signals $V_{OUTL}$ and $V_{OUTR}$ that represent independent input channel signals $V_{INL}$, $V_{INR}$, thereby operating example class-D amplifier as a dual-channel amplifier. Additionally, example class-D amplifier 20 includes a control provided by a switch S1 that, in response to a control signal select that is provided to a control input of example class-D amplifier 20, configures example class-D amplifier to operate as a differential class-D amplifier that is responsive to the difference between input channel signals $V_{INL}$, $V_{INR}$. In order to provide operation of example class-D amplifier 20 as a dual-channel amplifier, combiners 22E and 22F combine voltages $V_{INL}$, $V_{INR}$ of respective input channel signals $V_{INL}$, $V_{INR}$, so that input voltage $V_{in1}=(V_{INR}-V_{INL})/2$ and input voltage $V_{in2}=(V_{INR}+V_{INL})/2$. Since, as described above, output voltages $V_{OUTR}$ and Voum of respective output signals $V_{OUTL}$ and $V_{OUTR}$ have a common-mode voltage $V_{CM}$ set by input voltage $V_{in2}$ and are differential with respect to input voltage $V_{in1}$, and assuming unity gain for convenience:

$$V_{OUTR}=V_{in1}+V_{CM}=V_{in1}+V_{in2}$$

and $$V_{OUTL}=-V_{in1}+V_{CM}=-V_{in1}+V_{in2}$$

If input voltage $V_{in1}$ is encoded as $(V_{INR}-V_{INL})/2$ and input voltage $V_{in2}$ is encoded as $(V_{INR}+V_{INL})/2$, which are a difference and sum signal, respectively, then:

$$V_{OUTR}=(V_{INR}-V_{INL})/2+(V_{INR}+V_{INL})/2=V_{INR}$$

and $$V_{OUTL}=-(V_{INR}-V_{INL})/2+(V_{INR}+V_{INL})/2=V_{INL}$$

and thus two independent audio or haptic channels may be provided by the topology of example class-D amplifier 10 of FIG. 1. In instant example class-D amplifier 20, combiner 22E and scaler 23A provide input signal $V_{in1}=(V_{INR}-$ $V_{INL})/2$ and combiner 22F and scaler 23B provides input signal $V_{in2}=(V_{INR}+V_{INL})/2$ when control signal select is de-asserted, which provides a dual single-ended mode of operation of example class-D amplifier 20. When control signal select is asserted, a DC common-mode reference voltage $V_{CMref}$ is provided as input signal $V_{in2}=V_{CMref}$ and input signal Vii remains equal to $(V_{INR}-V_{INL})/2$, so that:

$$V_{OUTR}=V_{in1}+V_{CM}=(V_{INR}-V_{INL})/2+V_{CMref}$$

and $$V_{OUTL}=-V_{in1}+V_{CM}=-(V_{INR}-V_{INL})/2+V_{CMref},$$

which is a differential representation of the pair of input channel signals $V_{INL}$, $V_{INR}$ with a common mode voltage equal to common-mode reference voltage $V_{CMref}$. Therefore, when control signal select is asserted, and a differential pair of signals are provided as input channel signals $V_{INL}$, $V_{INR}$, example class-D amplifier 20 will operate as a differential amplifier having differential inputs and outputs.

In example class-D amplifier 20, a difference mode loop filter 24A receives an output of a combiner 22A that subtracts a feedback signal provided by a combiner 22B from the output of combiner 22E. Combiner 22B subtracts the voltage of output $V_{OUTR}$ of example class-D amplifier 20 from the voltage of output $V_{OUTL}$ of example class-D amplifier 20. The output of difference mode loop filter 24A provides a fully-differential quantization input to a quantizer 26. A differential output of quantizer 26 provides the output of modulator 25 that provides a differential input to corresponding inputs of non-overlap and skew control blocks 29A, 29B that are formed by analog or analog/digital hybrid networks. Non-overlap and skew control blocks 19A, 19B condition the risetimes of the outputs of quantizer 26 and prevent switching overlap between a pair of outputs of each of non-overlap and skew control blocks 19A, 19B that drive corresponding high-side switching transistors P1, P2 and corresponding low-side switching transistors N1, N2 to provide output signals $V_{OUTL}$ and $V_{OUTR}$. A common-mode loop filter 24B receives an output of a combiner 22D that subtracts a feedback signal provided by a combiner 22C from the signal selected by switch S1, which, as described above, is either a signal encoding input voltages $V_{INR}$, $V_{INL}$ as a sum $(V_{INR}+V_{INL})/2$ if control signal select is de-asserted, or common-mode reference voltage $V_{CMref}$ if control signal select is asserted. A combiner 22C adds the voltage of output $V_{OUTR}$ of example class-D amplifier 20 to the voltage of output $V_{OUTL}$ of example class-D amplifier 20 to generate the feedback signal.

Figure 3:
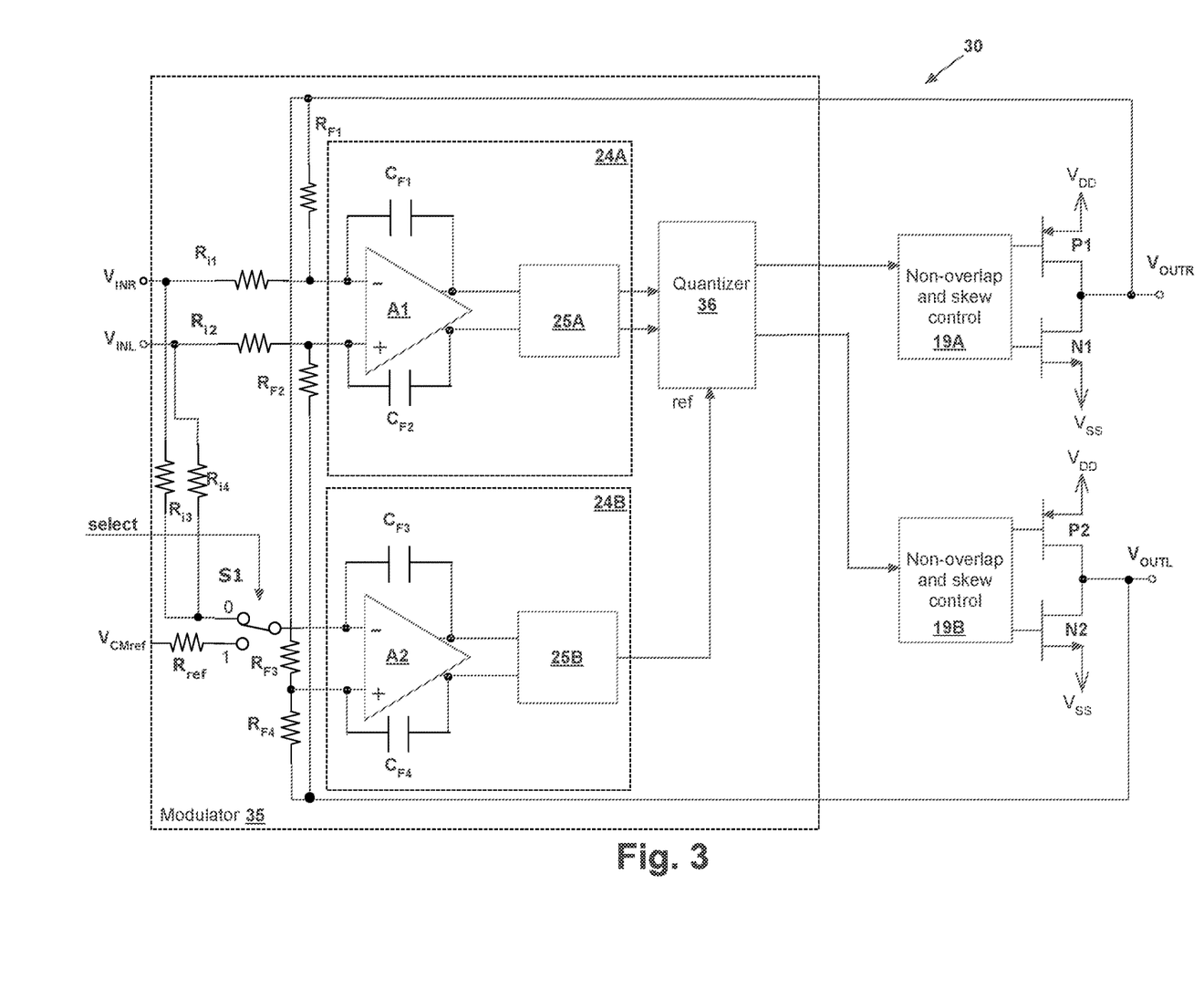
FIG. 3 is a simplified schematic diagram of an example amplifier 30 that may be used to implement amplifier 20 of FIG. 2, in accordance with an embodiment of the disclosure.

Referring now to FIG. 3, another example class-D amplifier 30 that may be used to implement Class-D amplifier 20 of FIG. 2 is shown, in accordance with an embodiment of the disclosure. Amplifier 30 of FIG. 3 is similar to amplifier 20 of FIG. 2, so only differences between them are described below. The combiner circuits in amplifier 30 are implemented at the first integrator of difference mode loop filter 24A and common-mode loop filter 24B, of a modulator 35. The first integrator stage of difference mode loop filter 24A is implemented by an operational amplifier A1, integrator feedback capacitors $C_{F1}$, $C_{F2}$ and associated input/feedback resistors $R_{i1}$, $R_{i2}$, $R_{F1}$ and $R_{F2}$. Input resistors $R_{i1}$, $R_{i2}$ couple a respective one of input channel signals $V_{INR}$, $V_{INL}$ to the respective summing node of operational amplifier A1, and feedback resistors $R_{F1}$, $R_{F2}$ couple output signals $V_{OUTR}$ and $V_{OUTL}$ to respective summing modes of operational amplifier A1, so that the combining of the feedback signals and the combining of the input signals at the input of difference-mode loop filter 24A as described above with reference to FIG. 2 is all performed by operational amplifier A1. Subsequent loop filter stages 25A process the output of the integrator formed by operational amplifier A1 to provide the differential output of difference mode loop filter 24A. Similarly, the first integrator stage of common-mode loop filter 24B is implemented by an operational amplifier A2, integrator feedback capacitors $C_{F3}$, $C_{F4}$ and associated input/feedback resistors $R_{i3}$, $R_{i4}$, $R_{F3}$ and $R_{F4}$, when control signal select is de-asserted to provide dual single-ended operation. When control signal select is asserted to provide differential operation, a resistor $R_{ref}$ couples common mode voltage reference $V_{CMref}$ to the inverting input of operational amplifier A2 by activating switch S1, which also disconnects operational amplifier A2 from input resistors $R_{i3}$ and $R_{i4}$. In dual-channel single-ended mode, input resistors $R_{i3}$, $R_{i4}$ couple a respective one of input channel signals $V_{INR}$, $V_{INL}$ to the respective summing node of operational amplifier A1, and in either mode, feedback resistors $R_{F3}$, $R_{F4}$ couple output signals $V_{OUTR}$ and $V_{OUTL}$ to respective summing modes of operational amplifier A2, so that the combining of the feedback signals and the combining of the input signals for at the inputs to the common-mode loop filter as described above with reference to FIG. 2 is all performed by operational amplifier A2. Subsequent loop filter stages 25B process the output of the integrator formed by operational amplifier A1 to provide the differential output of difference mode loop filter 24A.

Figure 4:
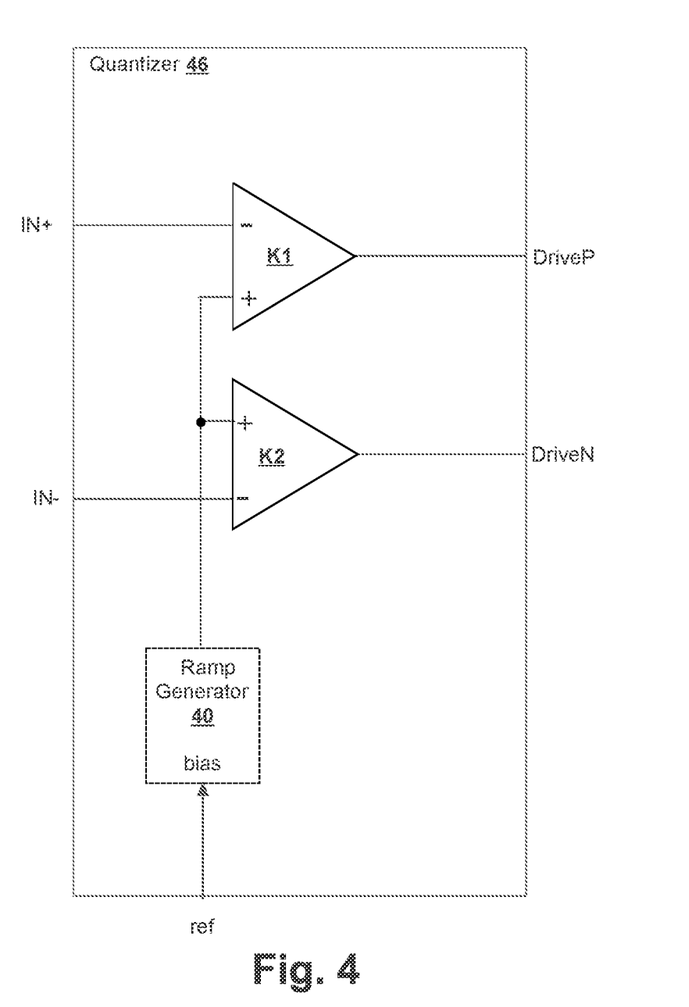
FIG. 4 is a block diagram of an example quantizer 46 that may be used to implement quantizer 26 of FIG. 2 and quantizer 36 of FIG. 3, in accordance with an embodiment of the disclosure.

FIG. 4 is a block diagram of an example quantizer 46 that may be used to implement quantizer 26 of FIG. 2 and quantizer 36 of FIG. 3, in accordance with an embodiment of the disclosure. A comparator K1 provides the positive output signal DriveP of the differential output of quantizer 46 by comparing the positive output signal of difference-mode loop filter 24A to a reference value, and a comparator K2 provides the positive output signal DriveN of the differential output of quantizer 46 by comparing the positive output signal of difference-mode loop filter 24A to the reference value. The reference input ref may be provided to the threshold inputs of comparators K1, K2 directly from the output of common-mode loop filter 25B, or alternatively the reference input ref may control the bias of an optional ramp generator 40, which may be needed if the modulator control loop does not stably ramp in voltage due to the feedback of the pulse waveforms of output signals $V_{OUTR}$ and $V_{OUTL}$ to common-mode loop filter 24B at each switching cycle of amplifier 20 of FIG. 2 and amplifier 30 of FIG. 3.

In summary, this disclosure shows and describes example circuits and integrated circuits having modulators and Class-D amplifiers. The modulators may have a first signal input for receiving a first channel input signal, a second signal input for receiving a second channel input signal, a combiner network that combines the first channel input signal and the second channel input signal to generate a first loop filter input signal and a second loop filter input signal, a first loop filter that receives the first loop filter input signal and generates a first output signal therefrom, a second loop filter that receives the second loop filter input signal and generates a second output signal therefrom, and a quantizer that combines the first output signal and the second output signal and generates a first modulator output signal representative of the first channel input signal and a second modulator output signal representative of the second channel input signal.

In some embodiments, the combiner network determines a difference between the first channel input signal and the second channel input signal to generate the first loop filter input signal, and generates the second loop filter input signal representative of a sum of the first channel input signal and the second channel input signal. In some embodiments, a quantization input of the quantizer receives the first output signal and a reference input of the quantizer receives the second output signal.

This disclosure also shows and describes example circuits and integrated circuits having Class-D amplifiers that include a first signal input for receiving a first channel input signal, a second signal input for receiving a second channel input signal, and a combiner network that receives the first channel input signal and the second channel input signal and generates a sum signal representative of a sum of the first channel input signal and the second channel input signal and a difference signal representative of a difference between the first channel input signal and the second channel input signal. A modulator circuit receives and combines the sum signal and the difference signal and generates a first modulator output signal representative of the first channel input signal at a first modulator output and a second modulator output signal representative of the second channel input signal at a second modulator output. The class-D amplifier also has a first driver circuit including a first high-side switch coupling the first output of the class-D amplifier to a positive power supply and a first low-side switch coupling the first output of the class-D amplifier to a negative power supply. An input of the first driver circuit is coupled to the first modulator output. The class-D amplifier also includes a second driver circuit including a second high-side switch coupling a second output of the class-D amplifier to a positive power supply and a second low-side switch coupling the second output of the class-D amplifier to a negative power supply, so that an input of the second driver circuit is coupled to the second modulator output.

In some example embodiments, the modulator of the class-D amplifier circuit may include a common mode loop filter circuit having an input coupled to a first output of the combiner for receiving the sum signal, a difference mode loop filter circuit having an input coupled to a second output of the combiner for receiving the difference signal, and a quantizer that receives and combines an output of the common mode loop filter circuit and an output of the difference mode loop filter circuit to generate the first modulator output signal and the second modulator output signal. A first feedback path may couple the first output of the class-D amplifier circuit and the second output of the class-D amplifier circuit to an input of the common mode loop filter circuit, so that the first feedback path controls a common mode voltage of the output of the first driver and the output of the second driver circuit. A second feedback path may couple the first output of the class-D amplifier circuit and the second output of the class-D amplifier circuit to the difference mode loop filter circuit. A quantization input of the quantizer may receive the output of the difference mode loop filter circuit and a reference input of the quantizer receives the output of the common mode loop filter circuit.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied in an integrated circuit (IC) having a switched-capacitor delta-sigma data converter with an internal filter capacitor.

What is claimed is:

1. A class-D amplifier circuit, comprising:
   a first signal input for receiving a first channel input signal;
   a second signal input for receiving a second channel input signal;
   a combiner network that receives the first channel input signal and the second channel input signal and generates a sum signal representative of a sum of the first channel input signal and the second channel input signal and a difference signal representative of a difference between the first channel input signal and the second channel input signal;
   a modulator circuit that receives and combines the sum signal and the difference signal and generates a first modulator output signal representative of the first channel input signal at a first modulator output and a second modulator output signal representative of the second channel input signal at a second modulator output;
   a first driver circuit including a first high-side switch coupling the first output of the class-D amplifier to a positive power supply and a first low-side switch coupling the first output of the class-D amplifier to a negative power supply, wherein an input of the first driver circuit is coupled to the first modulator output; and
   a second driver circuit including a second high-side switch coupling a second output of the class-D amplifier to a positive power supply and a second low-side switch coupling the second output of the class-D amplifier to a negative power supply, wherein an input of the second driver circuit is coupled to the second modulator output.

2. The class-D amplifier circuit of claim 1, wherein the modulator comprises;
   a common mode loop filter circuit having an input coupled to a first output of the combiner for receiving the sum signal;
   a difference mode loop filter circuit having an input coupled to a second output of the combiner for receiving the difference signal;
   a quantizer that receives and combines an output of the common mode loop filter circuit and an output of the difference mode loop filter circuit to generate the first modulator output signal and the second modulator output signal;
   a first feedback path coupling the first output of the class-D amplifier circuit and the second output of the class-D amplifier circuit to an input of the common mode loop filter circuit, wherein the first feedback path controls a common mode voltage of the output of the first driver and the output of the second driver circuit; and
   a second feedback path coupling the first output of the class-D amplifier circuit and the second output of the class-D amplifier circuit to the difference mode loop filter circuit.

3. The class-D amplifier circuit of claim 2, wherein a quantization input of the quantizer receives the output of the difference mode loop filter circuit and a reference input of the quantizer receives the output of the common mode loop filter circuit.

4. The class-D amplifier circuit of claim 2, wherein the combiner network comprises:
   a first combiner for summing a voltage of the first output of the class-D amplifier circuit and a voltage of the second output of the class-D amplifier circuit to provide the input of the common mode loop filter;

a second combiner for summing voltages of the first channel input signal and the second channel input signal to provide another complementary input to the common mode loop filter circuit; and a third combiner for determining a difference of the voltage of the first output of the class-D amplifier circuit and the voltage of the second output of the class-D amplifier circuit to provide the second feedback path to an input of the difference mode loop filter circuit.

5. The class-D amplifier circuit of claim 4, wherein the first combiner and the second combiner are provided by input nodes of an operational amplifier providing a first integrator stage of the common mode loop filter, and wherein the third combiner is provided by a first resistor coupling the output of the first driver circuit to a first input node of a second operational amplifier providing a first integrator stage of the difference mode loop filter and a second resistor coupling the output of the first feedback driver circuit to a second complimentary input node of the second operational amplifier.

6. The class-D amplifier circuit of claim 1, wherein the class-D amplifier circuit has an operating mode selectable between a single-ended mode of operation and a differential mode of operation, so that when the single-ended mode of operation is selected, the combiner network determines a difference between the first channel input signal and the second channel input signal to generate the difference signal, and sums the first channel input signal and the second channel input signal to generate the sum signal, and so that when the differential mode of operation is selected, the combiner network determines a difference between the first channel input signal and the second channel input signal to generate the difference signal, and provides a common-mode reference voltage as the sum signal, whereby the first driver output and the second driver output provide a differential output representative of the difference between the first channel input signal and the second channel input signal and have a common-mode voltage controlled by a value of the common-mode reference voltage.

7. A method of operating a class-D amplifier circuit, comprising:
receiving a first channel input signal;
receiving a second channel input signal;
generating a sum signal representative of a sum of the first channel input signal and the second channel input signal;
generating a difference signal representative of a difference between the first channel input signal and the second channel input signal;
combining the sum signal and the difference signal with a modulator to generate a first modulator output signal representative of the first channel input signal and a second modulator output signal representative of the second channel input signal;
producing a first power output signal of the class-D amplifier circuit from a first driver circuit including a first high-side switch coupling the first output of the class-D amplifier to a positive power supply and a first low-side switch coupling the first output of the class-D amplifier to a negative power supply in response to the first modulator output signal; and
producing a second power output signal of the class-D amplifier circuit from a second driver circuit including a second high-side switch coupling a second output of the class-D amplifier to the positive power supply and a second low-side switch coupling the second output of the class-D to the negative power supply in response to the second modulator signal.

8. The method of claim 7, wherein the combining comprises filtering the sum signal with a common mode loop filter circuit, filtering the difference signal with a difference mode loop filter circuit, wherein the quantizer combines an output of the common mode loop filter circuit and an output of the difference mode loop filter circuit, and wherein the method further comprises:
providing common-mode feedback from a first feedback path receiving the first power output signal and the second power output signal to an input of the common mode loop filter circuit; and
providing difference mode feedback from a second feedback path receiving the first power output signal and the second power output signal to an input of the difference mode loop filter circuit.

9. The method of claim 8, wherein the combining further comprises:
receiving the output of the difference mode loop filter circuit at a quantization input of the quantizer;
receiving the output of the common mode loop filter circuit at a reference input of the quantizer; and
quantizing the output of the difference mode loop filter circuit according to the output of the common mode loop filter circuit.

10. The method of claim 8, further comprising:
first summing a voltage of the first power output signal and a voltage of the second power output signal to provide a first portion of the common mode feedback;
second summing the voltage of the first channel input signal and the voltage of the second channel input signal to provide a second portion of the common mode feedback; and
determining a difference of the voltage of the first power output signal and the voltage of the second power output signal provide the difference mode feedback.

11. The method of claim 10, wherein the first summing, the second summing are performed at complementary input nodes of an operational amplifier providing a first integrator stage of the common mode loop filter, and wherein the determining a difference is performed by a first resistor coupling the output of the first driver circuit to a first input node of a second operational amplifier providing a first integrator stage of the difference mode loop filter and a second resistor coupling the output of the first feedback driver circuit to a second complimentary input node of the second operational amplifier.

12. The method of claim 7, further comprising:
receiving a selection between a single-ended mode of operation and a differential mode of operation of the class-D amplifier;
responsive to receiving selection of the single-ended mode of operation, performing the generating a difference signal; and
responsive to receiving selection of the differential mode of operation, providing a common-mode reference voltage as the difference signal instead of generating the difference signal from the difference between the first channel input signal and the second channel input signal, whereby the first power output signal and the second power output signal provide a differential output representative of the difference between the first channel input signal and the second channel input signal and have a common-mode voltage controlled by a value of the common-mode reference voltage.

13. A modulator circuit for a Class-D amplifier, the modulator circuit comprising:
- a first signal input for receiving a first channel input signal;
- a second signal input for receiving a second channel input signal;
- a combiner network that combines the first channel input signal and the second channel input signal to generate a first loop filter input signal and a second loop filter input signal;
- a first loop filter that receives the first loop filter input signal and generates a first output signal therefrom;
- a second loop filter that receives the second loop filter input signal and generates a second output signal therefrom; and
- a quantizer that combines the first output signal and the second output signal and generates a first modulator output signal representative of the first channel input signal and a second modulator output signal representative of the second channel input signal.

14. The modulator circuit of claim 13, wherein the combiner network determines a difference between the first channel input signal and the second channel input signal to generate the first loop filter input signal, and generates the second loop filter input signal representative of a sum of the first channel input signal and the second channel input signal.

15. The modulator circuit of claim 13, wherein a quantization input of the quantizer receives the first output signal and a reference input of the quantizer receives the second output signal.

16. The modulator circuit of claim 15, wherein the modulator has an operating mode selectable between a single-ended mode of operation and a differential mode of operation, so that when the single-ended mode of operation is selected, the combiner network determines a difference between the first channel input signal and the second channel input signal to generate the first loop filter input signal, and generates the second loop filter input signal representative of a sum of the first channel input signal and the second channel input signal, and so that when the differential mode of operation is selected, the combiner network determines a difference between the first channel input signal and the second channel input signal to generate the first loop filter input signal, and provides a common-mode reference voltage as the second loop filter input signal, whereby the first modulator output signal and the second modulator output signal provide a differential output representative of the difference between the first channel input signal and the second channel input signal and have a common-mode voltage controlled by a value of the common-mode reference voltage.

17. A method of operating a modulator for a class-D amplifier circuit, comprising:
- receiving a first channel input signal;
- receiving a second channel input signal;
- combining the first channel input signal and the second channel input signal to generate a first loop filter input signal and a second loop filter input signal;
- filtering the first loop filter input signal with a first loop filter to generate a first output signal;
- filtering the second loop filter input signal with a second loop filter to generate a second output signal; and
- combining the first output signal and the second output signal with a quantizer that generates a first modulator output signal representative of the first channel input signal and a second modulator output signal representative of the second channel input signal.

18. The method of claim 17, wherein the combining comprises:
- determining a difference between the first channel input signal and the second channel input signal to generate the first loop filter input signal; and
- generating the second loop filter input signal representative of a sum of the first channel input signal and the second channel input signal.

19. The method of claim 17, further comprising:
- receiving the first output signal at a quantization input of the quantizer; and
- receiving the second output signal at a reference input of the quantizer.

20. The method of claim 19, further comprising:
- receiving a selection between a single-ended mode of operation and a differential mode of operation of the modulator;
- responsive to receiving selection of the single-ended mode of operation, the combining determining a difference between the first channel input signal and the second channel input signal to generate the first loop filter input signal, and generating the second loop filter input signal representative of a sum of the first channel input signal and the second channel input signal;
- responsive to receiving selection of the differential mode of operation, the combining determining a difference between the first channel input signal and the second channel input signal to generate the first loop filter input signal; and
- responsive to receiving selection of the differential mode of operation, providing a common-mode reference voltage as the second loop filter input signal, whereby the first modulator output signal and the second modulator output signal provide a differential output representative of the difference between the first channel input signal and the second channel input signal and have a common-mode voltage controlled by a value of the common-mode reference voltage.

* * * * *

UNITED STATES PATENT AND TRADEMARK OFFICE
CERTIFICATE OF CORRECTION

PATENT NO. : 11,329,617 B1
APPLICATION NO. : 17/151877
DATED : May 10, 2022
INVENTOR(S) : Peterson et al.

It is certified that error appears in the above-identified patent and that said Letters Patent is hereby corrected as shown below:

In the Specification

In Column 1, Line 48, delete "entre" and insert -- entire --, therefor.

In Column 4, Line 46, delete "Voum" and insert -- $V_{OUTL}$ --, therefor.

In Column 5, Line 7, delete "Vii" and insert -- $V_{in1}$ --, therefor.

In Column 6, Line 23, delete "for at" and insert -- for --, therefor.

Signed and Sealed this
Thirteenth Day of September, 2022

Katherine Kelly Vidal
*Director of the United States Patent and Trademark Office*